(12) United States Patent
Crowley et al.

(10) Patent No.: US 9,312,108 B2
(45) Date of Patent: Apr. 12, 2016

(54) SPUTTERING APPARATUS

(71) Applicant: Sputtering Components, Inc., Owatonna, MN (US)

(72) Inventors: Daniel Theodore Crowley, Owatonna, MN (US); Patrick Lawrence Morse, Tuscon, AZ (US); John Robert German, Owatonna, MN (US); William A. Meredith, Jr., Faribault, MN (US)

(73) Assignee: Sputtering Components, Inc., Owatonna, MN (US)

( * ) Notice: Subject to any disclaimer, the term of this patent is extended or adjusted under 35 U.S.C. 154(b) by 0 days.

(21) Appl. No.: 14/263,250

(22) Filed: Apr. 28, 2014

(65) Prior Publication Data
US 2014/0246312 A1    Sep. 4, 2014

Related U.S. Application Data

(63) Continuation-in-part of application No. 14/019,877, filed on Sep. 6, 2013.

(60) Provisional application No. 61/771,460, filed on Mar. 1, 2013.

(51) Int. Cl.
*C23C 14/00* (2006.01)
*C25B 11/00* (2006.01)
(Continued)

(52) U.S. Cl.
CPC ........... *H01J 37/3444* (2013.01); *H01J 37/345* (2013.01); *H01J 37/3455* (2013.01); *H01J 37/3479* (2013.01); *H01J 37/34* (2013.01)

(58) Field of Classification Search
CPC .. H01J 37/3455; H01J 37/345; H01J 37/3476
See application file for complete search history.

(56) References Cited

U.S. PATENT DOCUMENTS

| 4,426,264 A | 1/1984 | Munz et al. |
| 5,047,131 A | 9/1991 | Wolfe et al. |

(Continued)

FOREIGN PATENT DOCUMENTS

| JP | H11061403 | 3/1999 |
| WO | 03015124 | 2/2003 |

(Continued)

OTHER PUBLICATIONS

U.S. Patent and Trademark Office, Office Action, from U.S. Appl. No. 14/019,877, Apr. 8, 2015, pp. 1-30, Published in: US.

(Continued)

*Primary Examiner* — Ibrahime A Abraham
(74) *Attorney, Agent, or Firm* — Fogg & Powers LLC

(57) ABSTRACT

A magnetron assembly for a rotary target cathode comprises an elongated support structure, a magnet bar structure movably positioned below the support structure, and a plurality of drive modules coupled to the support structure. The drive modules each include a motorized actuation mechanism operatively coupled to the magnet bar structure. A controller and battery module is coupled to the support structure and is in operative communication with the drive modules. The controller and battery module includes an electronic controller and at least one rechargeable battery. The battery is configured to energize each motorized actuation mechanism and the electronic controller. One or more power generation modules is coupled to the support structure and in electrical communication with the battery, such that electrical energy output from the power generation modules recharges the battery.

19 Claims, 11 Drawing Sheets

(51) Int. Cl.
  *C25B 13/00* (2006.01)
  *H01J 37/34* (2006.01)

(56) References Cited

U.S. PATENT DOCUMENTS

| | | | |
|---|---|---|---|
| 5,096,562 | A | 3/1992 | Boozenny et al. |
| 2002/0148725 | A1 | 10/2002 | Subramani et al. |
| 2004/0050690 | A1 | 3/2004 | Green et al. |
| 2006/0000705 | A1 | 1/2006 | Hartig et al. |
| 2008/0173535 | A1 | 7/2008 | Krempel-Hesse |
| 2009/0283400 | A1 | 11/2009 | Stowell et al. |
| 2010/0243428 | A1 | 9/2010 | Crowley |
| 2011/0062022 | A1 | 3/2011 | Goderis et al. |
| 2012/0211352 | A1 | 8/2012 | Premendra |
| 2014/0097080 | A1 | 4/2014 | Heinrich et al. |
| 2014/0246310 | A1 | 9/2014 | Crowley et al. |

FOREIGN PATENT DOCUMENTS

| | | |
|---|---|---|
| WO | 2009138348 | 11/2009 |
| WO | 2011068263 | 6/2011 |
| WO | 2013120920 | 8/2013 |

OTHER PUBLICATIONS

Korean Intellectual Property Office, International Search Report and Written Opinion from PCT Application No. PCT/US2014/018212 mailed Jun. 3, 2014, from PCT Counterpart of U.S. Appl. No. 14/019,877, Jun. 3, 2014, pp. 1-11, Published in: WO.

U.S. Patent and Trademark Office, Restriction Requirement, from U.S. Appl. No. 14/019,877, Feb. 12, 2015, pp. 1-6, Published in: US.

International Searching Authority, "International Search Report and Written Opinion from PCT Application No. PCT/US2015/021506 mailed Jun. 25, 2015", from PCT Counterpart of U.S. Appl. No. 14/263,250, Jun. 25, 2015, pp. 1-12, Published in: KR.

U.S. Patent and Trademark Office, "Final Office Action", from U.S. Appl. No. 14/019,877, Aug. 11, 2015, pp. 116, Published in: US.

Third Party Observation submitted in PCT Application No. PCT/US2014/018212 submitted on Jun. 29, 2015, from PCT Counterpart of U.S. Appl. No. 14/019,877, Jun. 29, 2015, pp. 16, Published in: WO.

Nam et al., "An Ultrasonic Sensor Based Low-Power Acoustic Modem for Underwater Communication in Underwater Wireless Sensor Networks", In Proceedings of the 2007 Conference on Emerging direction in embedded and ubiquitous computing (EUC'07), Dec. 2007, pp. 494-504.

U.S. Patent and Trademark Office, "Office Action", from U.S. Appl. No. 14/019,877, Dec. 2, 2015, pp 1-26, Published in: US.

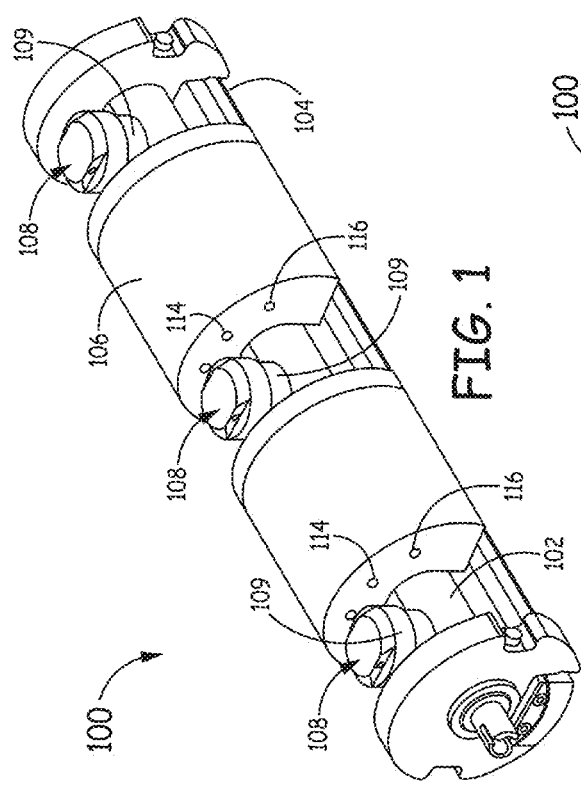
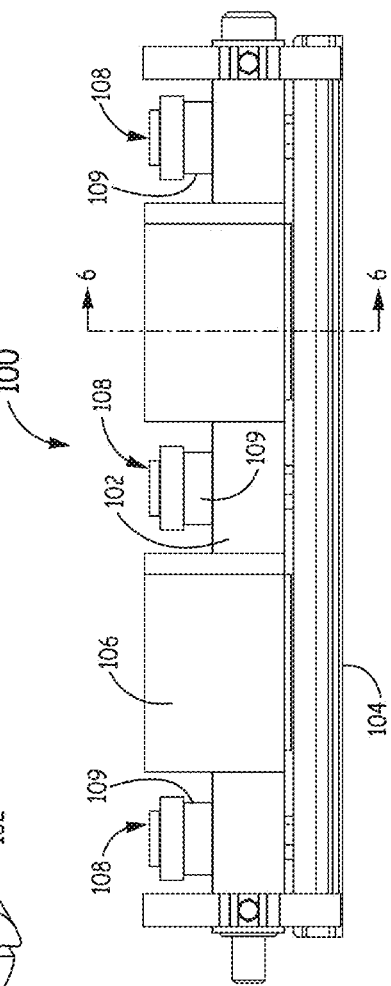
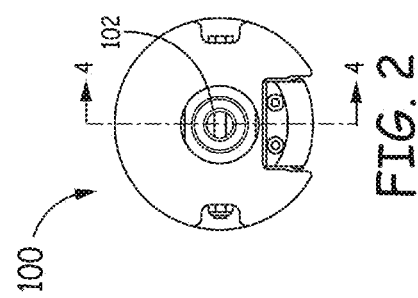

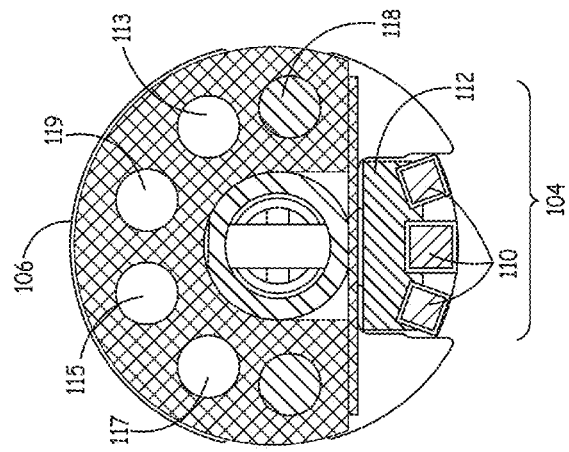
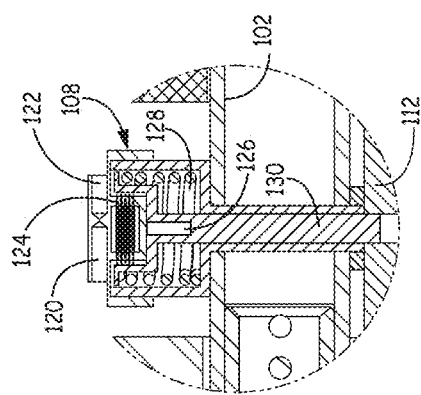
FIG. 5
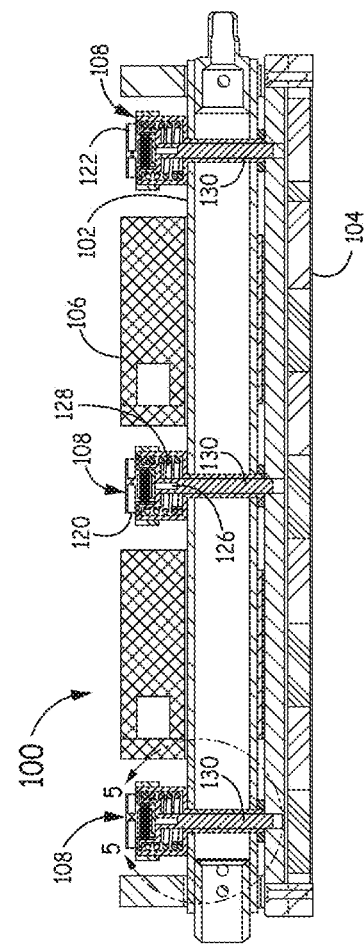
FIG. 6
FIG. 4

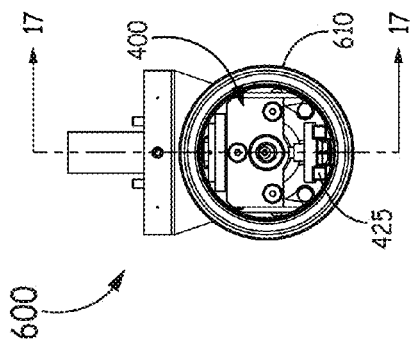
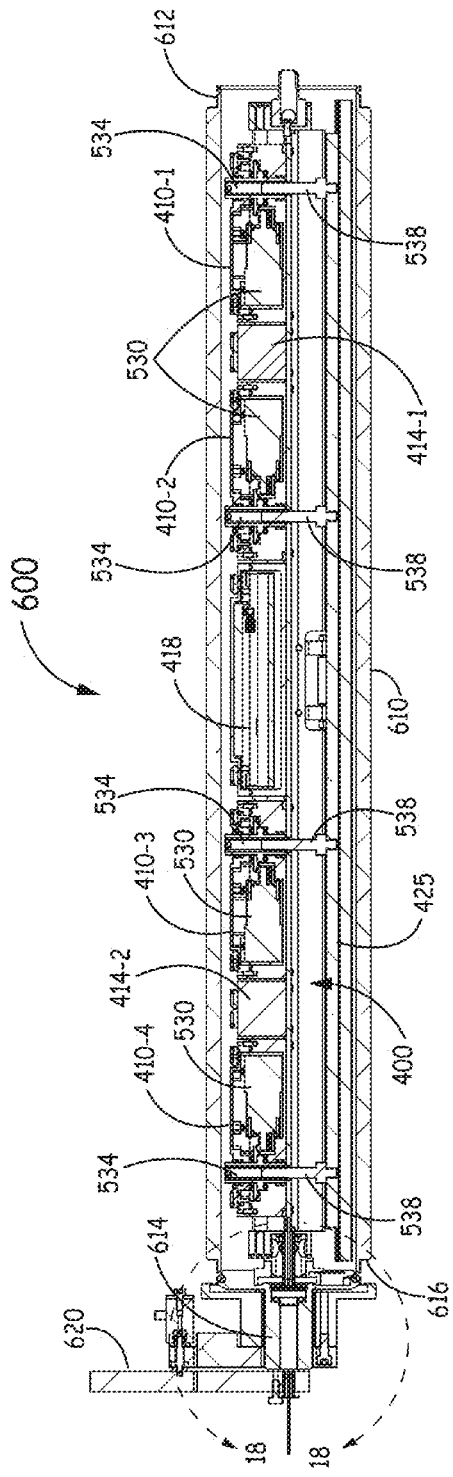
FIG. 16
FIG. 17

SPUTTERING APPARATUS

CROSS-REFERENCE TO RELATED APPLICATIONS

This application is a continuation-in-part of U.S. patent application Ser. No. 14/019,877, filed on Sep. 6, 2013, which claims the benefit of U.S. Provisional Patent Application Ser. No. 61/771,460, filed on Mar. 1, 2013, both of which are incorporated herein by reference.

BACKGROUND

Magnetron sputtering of rotating targets is well known and is used extensively for producing a wide variety of thin films on a wide variety of substrates. In the most basic form of rotating-target magnetron sputtering, the material to be sputtered is either formed in the shape of a tube or is adhered to the outer surface of a support tube made of a rigid material. A magnetron assembly is disposed within the tube and supplies magnetic flux, which permeates the target such that there is adequate magnetic flux at the outer surface of the target. The magnetic field produced by the magnetron assembly is designed in a way such that it retains electrons emitted from the target so as to increase the probability that they will have ionizing collisions with the working gas, hence enhancing the efficiency of the sputtering process.

It is becoming increasingly important to compensate for target erosion effects because it is desirable to increase target thickness and operate sputter processes under more sensitive process conditions. The desire for thicker targets is largely driven by fabrication costs of ceramic targets, but is also desirable in order to have a greater inventory of usable material inside the sputter coater in order to run longer coating campaigns. The need to run processes in more sensitive process conditions is driven by the desire to get higher deposition rates, in reactive mode sputtering, and/or to finely control film chemistry.

Fabrication cost for targets of some materials, in particular ceramic transparent conductive oxide (TCO) materials, are relatively high in comparison to the cost of the raw materials. To improve the economy of these targets, it is desirable to increase the thickness of the target material. In this way, the target will have significantly more usable material while adding only minimally to the overall cost of the target, as the fabrication cost does not change significantly. The only significant cost increase is due to the additional raw material used. In addition, thicker targets have the added benefit of allowing longer production campaigns between target changes.

Increasing the target thickness too much, however, can result in inadequate magnetic flux at the target surface when using standard magnetron assemblies. Magnetron designs with higher magnetic flux have recently been introduced to provide the higher magnetic flux required for the thicker targets.

In the case of reactive magnetron sputtering, metallic targets are sputtered in an atmosphere that contains reactive gas such as oxygen or nitrogen. The sputtered material reacts with the reactive gas in order to form a film comprised of compounds of the target material and the reactive gas. The reactive gas also reacts with the target surface, thereby forming reacted compounds on the target surface. The surface compounds greatly reduce the ablation rate. In order to improve the sputtering efficiency, the amount of reactive gas may be carefully controlled so as to minimize the target surface reactions while still achieving the desired film chemistry. In some cases, the processes need to be controlled such that the chemistry of the film is sub-stoichiometric.

This fine control over the process gas makes the process sensitive to small perturbations. The industry has seen considerable technological advances in power delivery and process gas control that have minimized many of the process perturbations. Nevertheless, little has been done to minimize variations in the magnetic confinement of the plasma. As the target erodes, the working surface gets closer to the magnetic assembly and the magnetic field becomes stronger. This changes the confinement of the plasma, altering the dynamics of the sputtering process. This presents a challenge in maintaining long-term stability of the process.

The typical magnetron assembly for rotating cathodes comprises three substantially parallel rows of magnets attached to a yoke of magnetically conductive material, such as steel, that helps complete the magnetic circuit. The direction of magnetization of the magnets is radial with respect to the major axis of the sputtering target. The center row of magnets has the opposite polarity of the two outer rows of magnets.

Magnetic flux of the inner and outer rows of magnets is linked through the magnetically conductive yoke, on one side of the magnets. On the other side of the magnets, opposite the yoke, the magnetic flux is not contained in a magnetically conductive material. Hence, the magnetic flux permeates substantially unimpeded through the target, which is substantially non-magnetic. Thus, two arc-shaped magnetic fields are provided at and proximate to the working surface of the target. These fields retain the electrons and cause them to drift in a direction perpendicular to the magnetic field lines, which is parallel to the rows of magnets. This is known as the ExB drift. In an ordinary arrangement, this drift path is also parallel to the major axis of the target.

Additionally, the outer rows of magnets are slightly longer that the inner row of magnets, and additional magnets, of the same polarity as the outer rows, are placed at the ends of the assembly between the two outer rows creating the so-called "turn-around" areas of the drift path. This has the effect of connecting the two drift paths, hence forming one continuous ovular "racetrack" drift path. This optimizes the retention of the electrons and therefore optimizes the efficiency of the sputtering process.

As the target erodes, the working surface comes closer to the magnet assembly, and the intensity of the magnetic field, at the working surface, increases in a non-linear fashion. For finely controlled processes it very desirable to modify the magnetic field, as the target erodes, so as to minimize variability of the process, thereby making the process easier to control over the course of the target life.

The need for changing the magnetic field as the target erodes is well known, and has been accomplished in the case of planar sputtering cathodes. The need for an adjustable magnetron for rotating cathodes has gone unsatisfied, however, because the geometry and mechanical structure of the cathodes make the task especially challenging.

International Publication WO 2013/120920 (the '920 publication) discloses an end-block for rotatably carrying a sputter target tube and restraining an adjustable magnet bar inside the target tube. Connectors are employed inside the end-block for power and communication feeds. Use of these connectors would require significant redesign of a typical end-block, making retro-fitting of older cathodes infeasible with such connectors.

SUMMARY

A magnetron assembly for a rotary target cathode comprises an elongated support structure, a magnet bar structure movably positioned below the support structure, and a plurality of drive modules coupled to the support structure. The drive modules each include a motorized actuation mechanism operatively coupled to the magnet bar structure. A controller and battery module is coupled to the support structure and is in operative communication with the drive modules. The controller and battery module includes an electronic controller and at least one rechargeable battery. The battery is configured to energize each motorized actuation mechanism and the electronic controller. One or more power generation modules is coupled to the support structure and in electrical communication with the battery, such that electrical energy output from the power generation modules recharges the battery.

BRIEF DESCRIPTION OF DRAWINGS

FIG. 1 is a perspective view of a magnetron assembly for a rotatable target cathode according to one embodiment;

FIG. 2 is an end view of the magnetron assembly of FIG. 1;

FIG. 3 is a side view of the magnetron assembly of FIG. 1;

FIG. 4 is a cross-sectional side view of the magnetron assembly taken along line 4-4 of FIG. 2;

FIG. 5 is an enlarged sectional view of the magnetron assembly taken along line 5-5 of FIG. 4;

FIG. 6 is a cross-sectional end view of the magnetron assembly taken along line 6-6 of FIG. 3;

FIG. 16 is an end view of a rotary target cathode according another embodiment that contains the magnetron assembly of FIG. 11;

FIG. 17 is a cross-sectional side view of the rotary target cathode taken along line 17-17 in FIG. 16.

DETAILED DESCRIPTION

Figure 7:
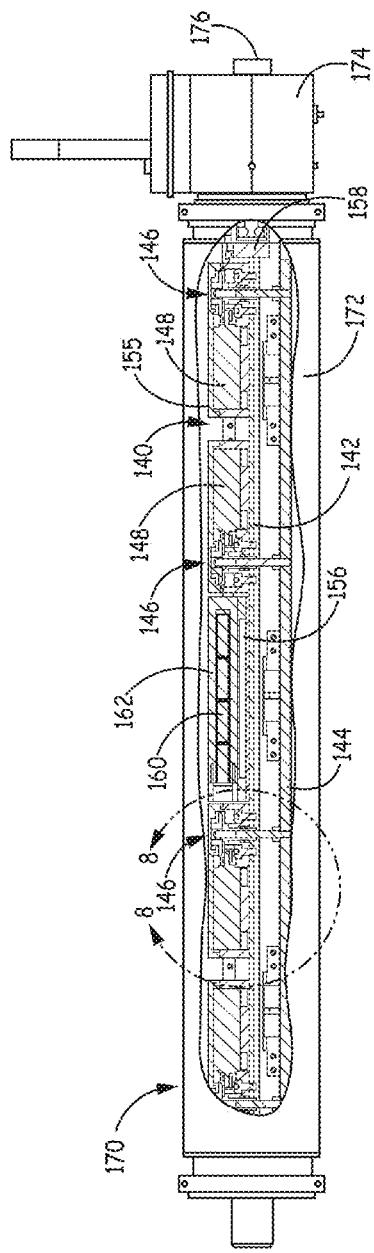
FIG. 7 is a cross-sectional side view of a magnetron assembly in a rotatable target cathode according to another embodiment.

An apparatus and technique for rotating-cathode magnetron sputtering is provided that deals with the variation in magnetic intensity at the sputtering surface as a target erodes, which results in changing process conditions. By magnetically compensating for target erosion effects, the present approach improves process stability.

In some embodiments, can adjustments in the position of a magnetron assembly be made by pneumatic or hydraulic pressure that pushes against a spring loaded mechanical structure. The spring can push the magnetron assembly either towards the nearest or towards the furthest distance from the target's working surface while the pneumatic or hydraulic pressure pushes against the spring, in the opposite direction. The applied pressure will determine the position of the assembly. In such embodiments, the pressure-carrying line can be disposed within a central water tube, on which the magnetron assembly is generally mounted. This location is beneficial because the water tube remains static. Thus, no seals are required on moving parts and reliability is optimized.

In one embodiment, energy is provided to a pneumatic actuator through a pressurized gas cylinder disposed within the target assembly. The high-pressure gas cylinder can be a commercially available carbon dioxide ($CO_2$) cartridge, for example.

In other embodiments, the motion for making adjustments can be provided by a cable, which also can be disposed within the water tube. In one example, the cable can be rotary, such as in a speedometer of a car. In another example, the cable can be push/pull, such as in a hand-brake cable on a bicycle.

Depending on the specific design of the cathode being used, some embodiments of the present approach can provide motion directly by way of a rotary or linear shaft that is disposed within the water tube along the axis of the target assembly. The shaft passes from air to water through an air-to-water seal, such as a rotary seal. In the case of linear motion, the motion can be transmitted via a bellows, which provides complete air-to-water isolation and transfers motion through compression or expansion of the bellows.

In some cathode designs, one end of the target assembly is attached to an end-block through which all functions pass, and the other end of the target is capped. This type of cathode is referred to as a single-ended cathode. The capped end may or may not be supported by a bearing. In this type of cathode design, the above mentioned bellows can be part of the end-cap design.

Another method of providing a mechanical feed-through is magnetically. A magnetic assembly inside the target structure can magnetically couple to an assembly outside the target. The motion of the external assembly will translate, via the magnetic link, through a solid wall. Such an arrangement can most easily be implemented as part of the end-cap of a single-ended cathode design.

In other embodiments, adjustments can be driven by taking advantage of the motion of the target rotation relative to the static magnetron/water-tube assembly. This can be done by providing a mechanical structure, such as gears, to harness the rotary motion of the target to drive the actuators used to make the adjustment. In another embodiment, adjustments can be driven by harnessing the water flow through the cathode, as by a turbine or water-wheel mechanism, such as when the water flows through the central water tube. In such cases as the target rotation or water flow driven embodiments, it is necessary to provide a structure for engaging and dis-engaging the mechanism from outside the coater, such as a switching mechanism, which can use any of the mechanical feed-through methods previously discussed.

In further embodiments, adjustments can be made by internal motors such as servos or stepper motors contained within the target assembly, which can be either submergible or contained inside a water-tight housing. These motors can apply torque directly to an adjustment screw, or there can be intermediate mechanics. The intermediate mechanics can be worm gears, bevel gears, or rack and pinions, for example, which change the direction of motion. Such mechanics can also serve as gear reductions in order to adjust the relative torque between the output torque of the motor and the desired torque to be applied to the adjustment screw.

In an alternative approach, piezo-electric motors can be utilized in the actuation mechanism. The piezo-electric motor provides a linear motion. This motion can be translated to rotary motion, to drive an adjustment screw, by applying tangential force to a gear that is affixed to the adjustment screw. Other linear motion options include electric solenoids, and pneumatic or hydraulic cylinders.

While power for internal motors can be provided by wires that are run through the water tube assembly, difficulties can arise in shielding these wires from the electrical power applied to the cathode, and because of the extra connection required when assembling the target. Alternately, power can be routed in by brush contacts, especially on a capped end of a single-ended cathode.

Another method of driving internal motors is by providing battery packs within the target cavity. In this approach, power can be switched on and off by any of the mechanisms previously discussed. As battery packs hold a finite amount of energy, the number of adjustments during a production campaign can be limited. In most cases, battery life will be sufficient since the number of adjustments required will be few. In order to augment the system power, one or more optional power generator modules, such electrical generators, can be added to the magnetron assembly. Output power, from the generator modules, can be used to keep the batteries charged or used to directly drive the motors of the magnetron assembly. Mechanical energy, needed to drive the generator modules, can be harnessed from the flow of the cooling water, or by the rotational energy of the target cylinder relative to the magnetron assembly. For example, small turbine generators that run off the water flow can be implemented in the generator modules in one embodiment.

In general, pneumatic embodiments of the actuator require less power than motorized embodiments.

In another embodiment, an electronic internal control module can be located within the target assembly. Command and feedback communications between the operator and the internal control module can be done by a variety of methods that do not require significant alteration of the cathode.

One method for remote communicating with the internal control module is by a power-line overlay signal. In this case, the communications signal is transmitted through the same conductance path as the power applied to the target. However, communications frequencies must be chosen to be very different from any power frequency of the sputtering power supply. Additionally, it may be necessary to send redundant signals to compensate for electrical noise that is occasionally generated by the sputtering process. This method of communication has the advantages of being easily implemented in most rotary cathode designs with virtually no modifications to the cathode structure and requires no special feed-through.

Alternate methods of communicating with the control module include transmitting signals through a window in the cathode or target assembly. The most convenient place for such a window is as the center of the end cap of the single-ended type cathode. In this way, it is not necessary to adapt the end-block to comprise connectors, as with the '920 publication. It is not even necessary to provide a connector. Rather, in the present configuration of the windowed end cap, it is only necessary that optical fibers, on either side of the window, are in sufficient proximity and alignment to effectively communicate, and are sufficiently shielded from the plasma to prevent signal noise.

Exemplary types of signals that can be sent through this window include radio, Wi-Fi, Bluetooth, optical, magnetic induction, or the like. Digital optical communications have the advantage of being immune to interference from electro-magnetic noise produced by the sputtering process, but the communication path needs reasonable shielding from light. Radio and Wi-Fi signals need shielding from electro-magnetic noise. Magnetic induction communication involve two inductive coils in close proximity, where a first coil is activated by an electric current and a second coil acts as a pick-up coil that generates a voltage signal in response to the magnetic field produced by the first coil. All of these methods can provide two-way communications. A variation of the magnetic induction method is to replace one of the coils with a Hall sensor, but this limits communications to one-way.

Another alternative for remote communication is by use of a pair of ultrasonic transceivers. Ultrasonic communication has the advantage in that there is more versatility in where the transceivers are mounted, since they do not require line-of-sight or any special window through which to transmit. Additionally, ultrasonic transceivers do not suffer from any electro-magnetic noise, optical noise, or optical impedance. The advantages of ultrasonic communication make it easier to retrofit cathodes produced by a variety of manufacturers.

A method of sensing the position of the magnet assembly, relative the target working surface, is also provided. In one approach, direct measurement is performed using an analog or digital linear motion indicator. If the motion is driven by servos or stepper motors, a feedback signal is available from these motors. An alternate method for sensing position is to measure gas pressure inside the pneumatic elements. Another method is to have a magnet and a Hall probe mounted in the apparatus such that they move relative to one another as adjustments are made. The Hall probe will have a different voltage output depending on its distance from the magnet.

The various techniques disclosed herein can be used to position the entire magnet assembly as a single unit, or to position multiple points along the length of the magnet assembly, independently, so as to make it possible to also adjust uniformity of the process.

FIGS. 1-3 and 6 illustrate various views of a magnetron assembly 100 for a rotatable target cylinder according to one embodiment. In general, magnetron assembly 100 includes a rigid support structure 102 such as a coolant tube, a magnet bar structure 104 movably attached to support structure 102, and one or more actuation mechanisms 108 coupled to support structure 102. The actuation mechanisms 108 are configured to change a distance of magnet bar structure 104 from a surface of the rotatable target cylinder.

The actuation mechanisms 108 are covered by an actuator housing 109. A position indicating mechanism is located in actuator housing 109 and is operative to measure the position of magnet bar structure 104 relative to the surface of the rotatable target cylinder. The magnet bar structure 104 includes an array of substantially parallel rows of magnets 110 attached to a yoke 112, as shown in FIG. 6. The yoke 112 is comprised of a magnetically conductive material such as steel, which helps to complete a magnetic circuit.

A control housing 106 partially surrounds support structure 102 and contains a communications device configured to receive command signals from outside of magnetron assembly 100 and transmit information signals to outside of magnetron assembly 100. The control housing 106 also encloses an electronic controller in operative communication with actuation mechanisms 108. The communications device can be a transceiver that is operatively coupled to the electronic controller. The transceiver can be a radio frequency (RF) transceiver, an optical transceiver, or an ultrasonic transceiver, for example. As shown in FIG. 1, control housing 106 defines a position feedback connection port 114 and one or more actuation connection ports 116.

The position indicating mechanism can be implemented as a built-in position sensor in each actuation mechanism 108. The position sensor can measure the position of magnet bar structure 104 either by direct sensing or by an indirect metric. For example, the position indicating mechanism can be implemented with a Hall probe and a magnet in an analog sensor. Alternatively, the position indicating mechanism can be implemented with a digital indicator, such as a plunger style digital indicator, which transmits data directly to an operator without additional processing.

In addition, a power source can be provided to energize actuator mechanisms 108 and the electronic controller. The power source can be fully self-contained within the volume of the magnetron assembly. For example, a power supply such as a battery pack can be located in control housing 106.

The actuation mechanisms 108 can be implemented in various ways. For example, the actuation mechanisms 108 can include a spring-loaded pneumatic structure or a spring loaded hydraulic structure. Alternatively, the actuation mechanisms 108 can include a rotary cable or a push/pull cable.

In one embodiment, each actuation mechanism 108 can include a spring-loaded pneumatic bellows, bladders, or cylinders. In this approach, adjustment points are spring loaded with the pressure in the pneumatic element pushing in the opposite direction. Reserve energy for making adjustments can be stored in a compressed gas supply such as a $CO_2$ gas cartridge. Adjustments can be made by adjustment valves that either release compressed gas from the $CO_2$ gas cartridge into the pneumatic elements, or release gas from the pneumatic elements into cooling water inside the target.

Further details of one embodiment of actuation mechanisms 108 with built-in position sensing are depicted in FIGS. 4 and 5. In this embodiment, the actuation mechanisms 108 include a sensor port 120 for a Hall probe, a pneumatic actuation port 122 configured to receive a compressed gas, and a bellows 124 such as a welded bellows in communication with pneumatic actuation port 122. A control shaft 130 is coupled to bellows 124 and yolk 112 of magnet bar structure 104. A return spring 128 is coupled to control shaft 130, and a magnet 126 is located in control shaft 130 for Hall probe feedback. The Hall probe/magnet in this embodiment is an analog detector for position sensing. FIG. 6 illustrates exemplary locations within control housing 106 for a control board 113 for the controller, one or more solenoid valves 115, transceivers 117, a $CO_2$ gas cartridge 118 in fluid communication with the solenoid valves, and a battery 119 to run the control board, which are used with the actuation mechanisms 108 of FIGS. 4 and 5.

As discussed previously, the actuation mechanisms can alternatively be implemented with a motorized structure, such as a servo, a stepper motor, or a piezo-electric motor. Any number of mechanical configurations can be used for the drive motion. One example is a screw jack, which may additionally incorporate right-angle gears or reduction gears. In these embodiments, position sensing of the magnet bar can be carried out through feedback from the motorized structures.

Figure 8:
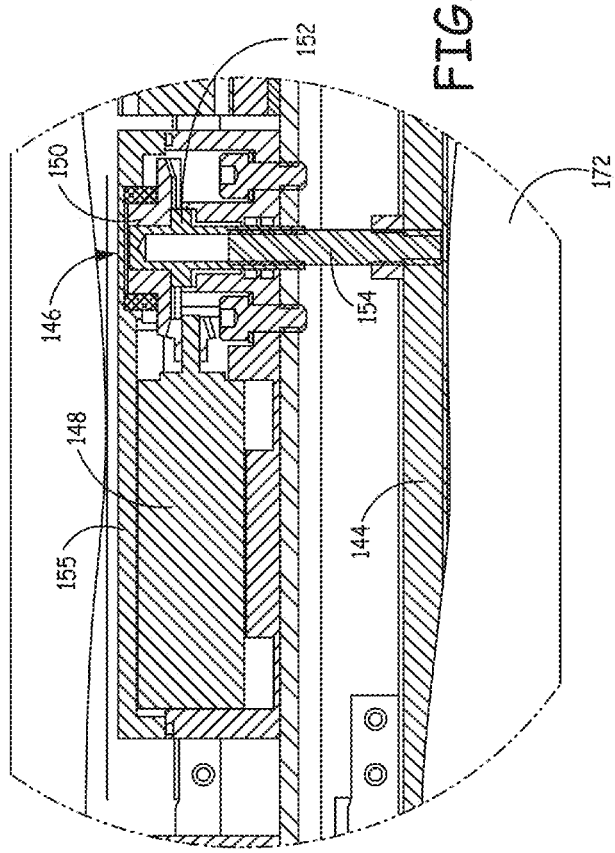
FIG. 8 is an enlarged sectional view of the magnetron assembly taken along line 8-8 of FIG. 7.

FIGS. 7 and 8 illustrate a magnetron assembly 140 implemented with a motorized structure in a rotatable target cathode 170 according to one embodiment. In general, magnetron assembly 140 is disposed inside of a target cylinder 172 and includes a rigid support structure 142, a magnet bar structure 144 movably attached to support structure 142, and a plurality of motorized actuation mechanisms 146 coupled to support structure 142. The motorized actuation mechanisms 146 include geared stepper motors 148, which can have a 100:1 gear reduction, for example. A set of bevel gears 150 is operatively coupled to stepper motors 148. The bevel gears 150 can have a 4:1 gear reduction, for example. A threaded housing 152 is mated with each of bevel gears 150. A threaded post 154 is coupled between magnet bar structure 144 and threaded housing 152. An actuator housing 155 encloses each of motorized actuation mechanisms 146.

The magnetron assembly 140 also includes an electronic controller 156 in operative communication with motorized actuation mechanisms 146. A communications device such as an ultrasonic transceiver/transducer 158 is operatively coupled to electronic controller 156. Power for stepper motors 148 and electronic controller 156 can be provided by a battery pack 160. A control housing 162 encloses electronic controller 156 and battery pack 160.

The target cylinder 172 is rotatably attached to an end block 174 as shown in FIG. 7. An ultrasonic transceiver/transducer 176 is mounted on end block 174 and is in communication with ultrasonic transceiver/transducer 158.

Figure 9:
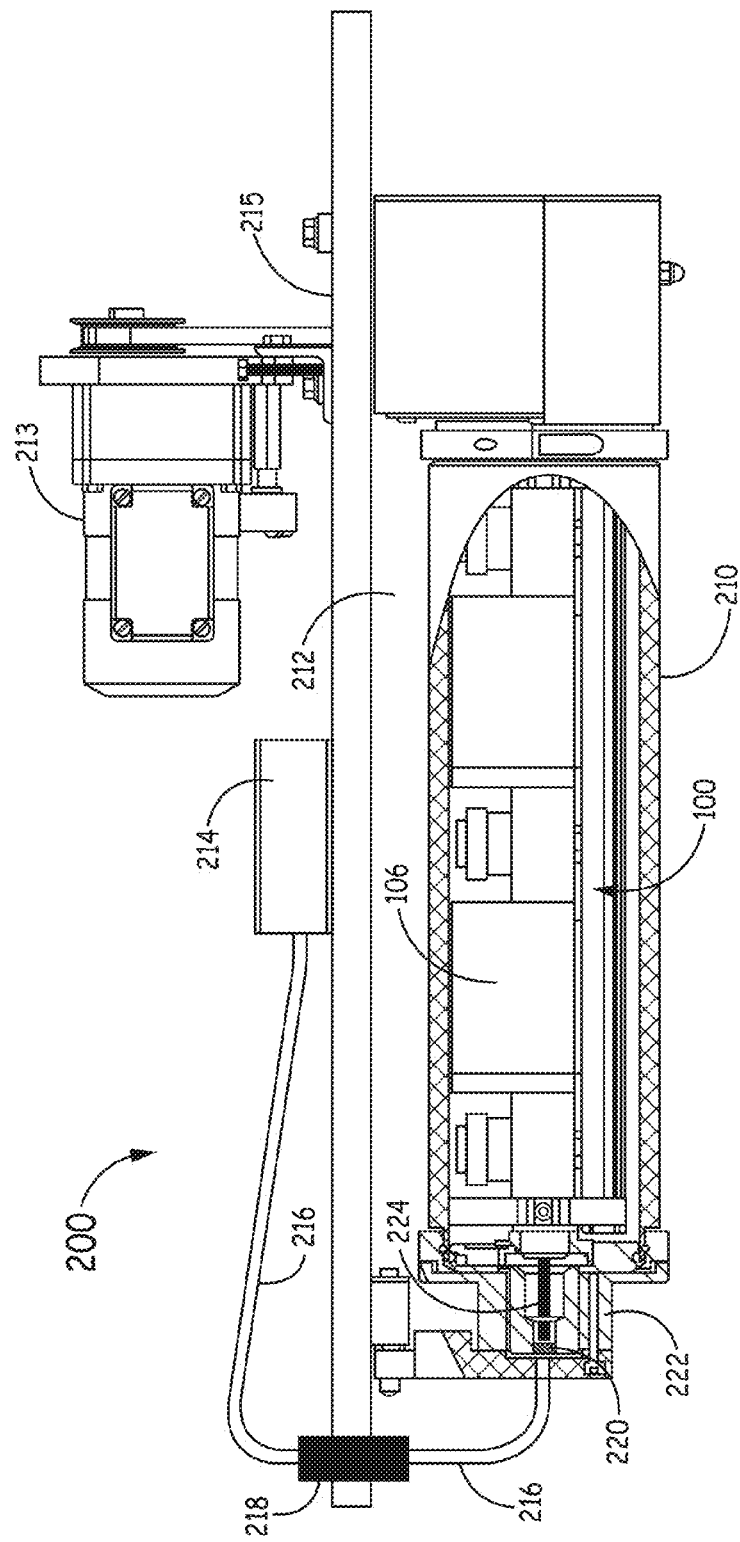
FIG. 9 is a partial cross-sectional side view of a sputtering apparatus according to one embodiment.

FIG. 9 illustrates a sputtering apparatus 200 according to another embodiment that is configured for two-way optical communications. A rotatable cathode target cylinder 210 is disposed within a vacuum chamber 212 having an outer wall 215. The target cylinder 210 is operatively coupled to a motor 213 mounted on outer wall 215 outside of vacuum chamber 212. A magnetron assembly 100, such as described previously with respect to FIGS. 1-3, is located within target cylinder 210.

As depicted in FIG. 9, an optical communications box 214 is located outside of vacuum chamber 212 on outer wall 215. A first fiber optic cable 216 in atmosphere is optically coupled to a first optical transceiver in optical communications box 214. The fiber optic cable 216 is also coupled to a vacuum coupler 218, which provides a feedthrough from atmosphere to vacuum for fiber optic cable 216. A second fiber optic cable 224 is coupled to a second optical transceiver inside control housing 106 through a cathode water cooling circuit of target cylinder 210. A fiber optic window 220 in an end cap 222 of target cylinder 210 allows an optical signal to be transmitted between fiber optic cable 216 and fiber optic cable 224.

Figure 10:
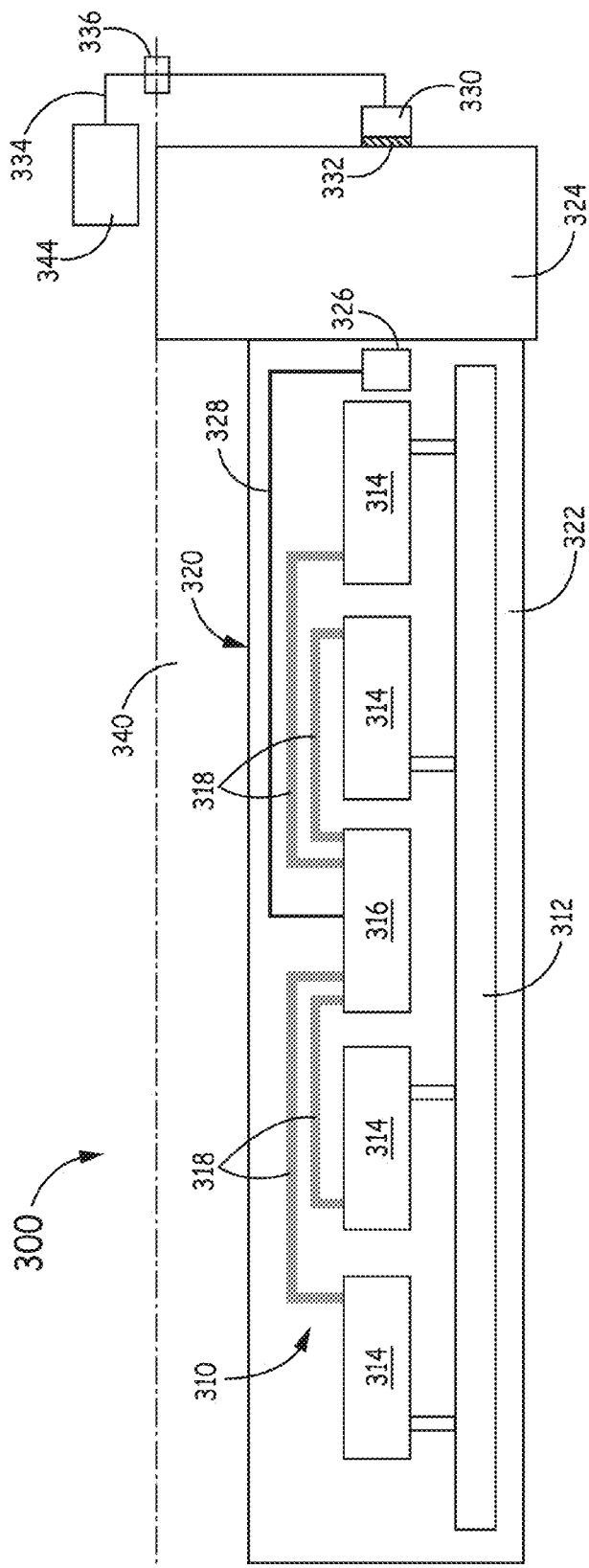
FIG. 10 is a schematic illustration of a sputtering apparatus according to another embodiment.

FIG. 10 is a schematic illustration of a sputtering apparatus 300 according to another embodiment, which is configured for two-way ultrasonic communications between a magnetron assembly 310, located within a rotary cathode assembly 320 in a vacuum chamber 340, and an external controller 344 outside of vacuum chamber 340. The magnetron assembly 310 includes a magnet bar structure 312, and a plurality of motorized actuation mechanisms 314 mechanically coupled magnet bar structure 312. An internal electronic controller 316 is in operative communication with motorized actuation mechanisms 314, such as through motor control cables 318 that can include two sets of twisted pairs. A battery pack housed with electronic controller 316 provides power to motorized actuation mechanisms 314 and electronic controller 316.

The rotary cathode assembly 320 includes a target cylinder 322, which can be filled with water, rotatably coupled to an end block 324. A first ultrasonic transceiver 326 is mounted inside of target cylinder 322 and is in signal communication with electronic controller 316, such as through an ultrasonic communication wire 328 that can include one twisted pair. A second ultrasonic transceiver 330 is mounted on end block 324 over an insulator 332 and is in ultrasonic communication with ultrasonic transceiver 326. The external controller 344, which can be operated by a user, is in signal communication with ultrasonic transceiver 330, such as through an ultrasonic communication wire 334 that passes through a vacuum coupler 336, which provides a feedthrough from atmosphere to vacuum chamber 340.

In one implementation, electronic controller 316 is capable of controlling up to twelve (12) axes of motion for magnet bar structure 312, with only one motor of a motorized actuation mechanism 314 being controlled at any one time. The control theory for electronic controller 316 can be adapted to move each motor a small amount in a given sequence. Controlling only one motor at a time simplifies the control system and reduces the battery requirements as there is a lower instantaneous power draw. In addition, the control lines can be routed with a communications bus on the magnet bar side of an I-beam support. A water sealed electrical connection can be used between each controlled unit and the communications bus.

In another embodiment, a system for two-way transmission of information between a magnetron assembly contained within a cathode target assembly and outside of a vacuum chamber can also be provided. For example, two-way communications can be carried out by two RF transceivers strategically placed, with one transceiver inside the target assembly and one transceiver outside the target assembly but inside the vacuum chamber. The transceiver inside the target assembly is directly connected to the electronic controller. The transceiver in the vacuum chamber is connected to the outside via an electrical feed-through in the chamber wall. It is necessary to provide a window between transceiver antennas that is transparent to the communication signal. The window can be located as part of the end cap of the single-ended cathode.

Figure 11:
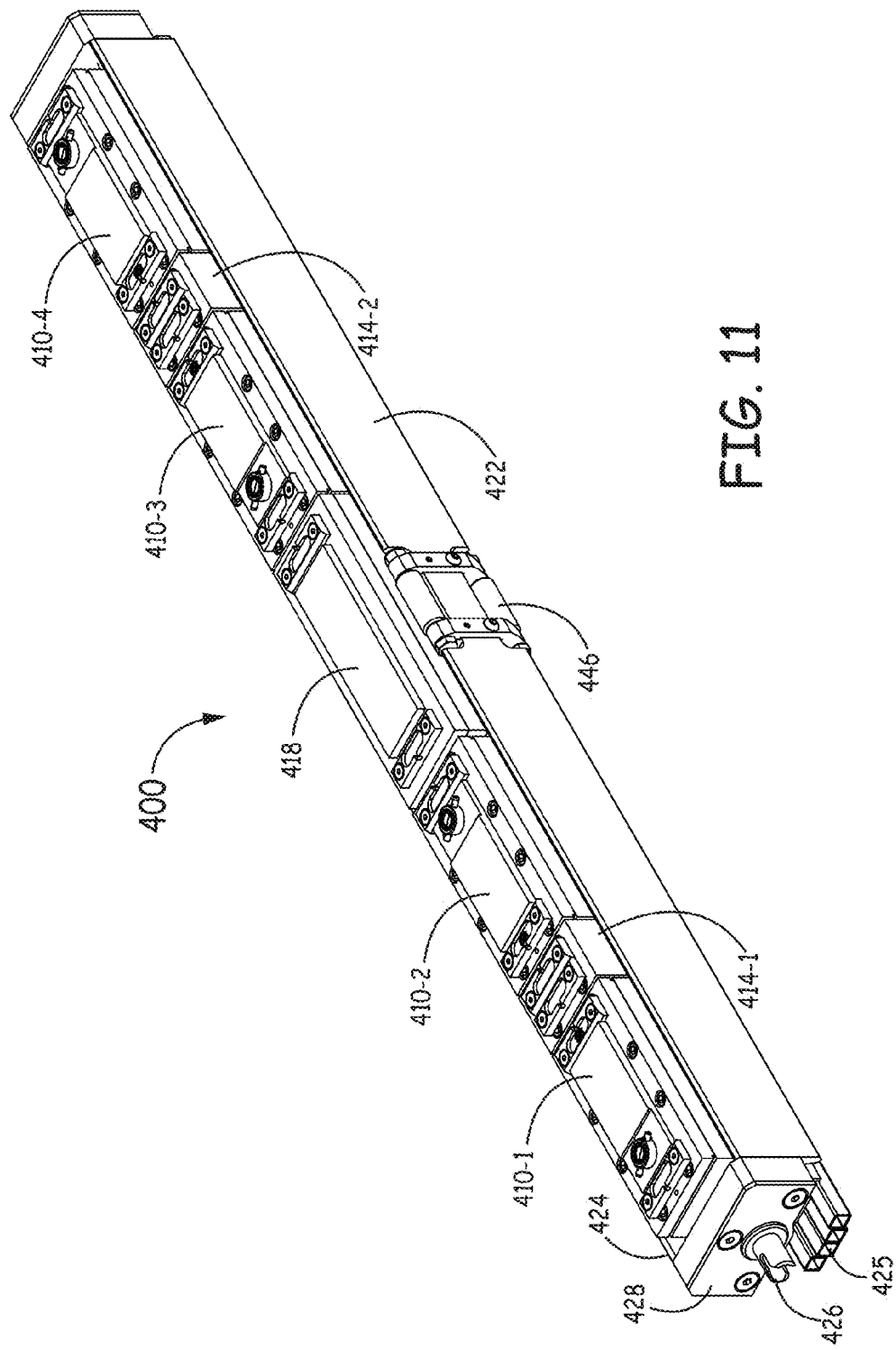
FIG. 11 is a perspective view of a magnetron assembly for a rotary target cathode according to another embodiment.
Figure 12:
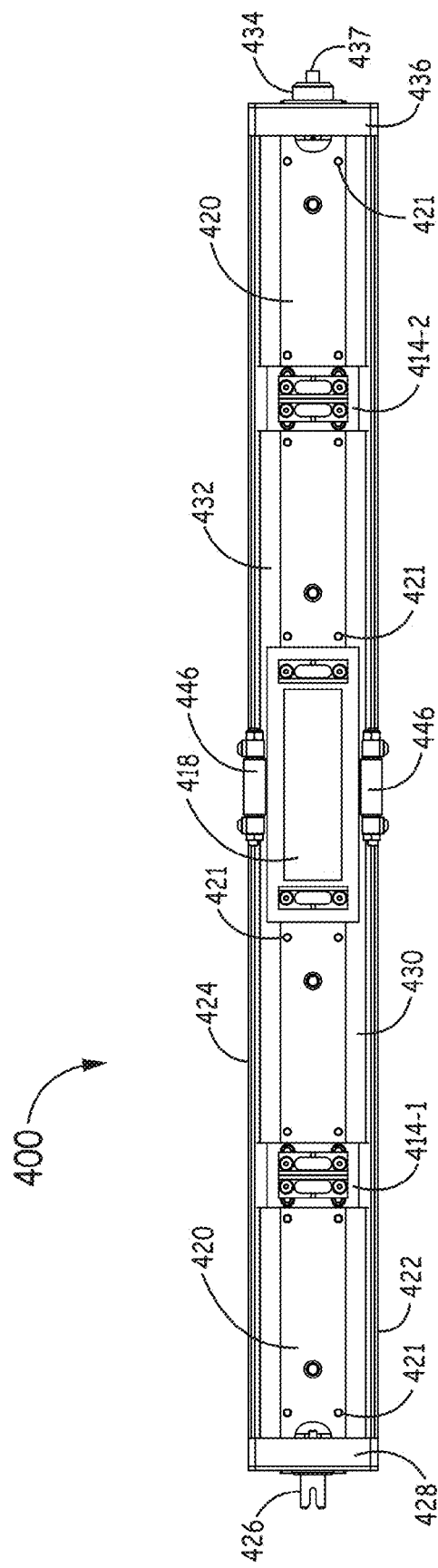
FIG. 12 is a top view of the magnetron assembly of FIG. 11, with some of the components removed to show internal structures.

FIGS. 11 and 12 illustrate a magnetron assembly 400 for a rotary target cathode according to another embodiment. The magnetron assembly 400 generally includes a plurality of drive modules 410, and a plurality of power generation modules 414 located along the length of magnetron assembly 400. The magnetron assembly 410 also includes a controller and battery module 418 in operative communication with drive modules 410 and power generation modules 414. The drive modules 410, power generation modules 414, and controller and battery module 418, are each positioned between a pair of opposing side walls 422, 424 that extend along the length of magnetron assembly 400.

As shown in the exemplary embodiment of FIG. 11, a first drive module 410-1 and a second drive module 410-2 are located on opposite sides of a first power generation module 414-1. A third drive module 410-3 and a fourth drive module 410-4 are located on opposite sides of a second power generation module 414-2, which can act as a redundant power generation source in case power generation module 410-1 fails. The controller and battery module 418 is located in a central portion of magnetron assembly 400 between drive module 410-2 and drive module 410-3.

FIG. 12 is a top view of magnetron assembly 400, with the drive modules removed. An elongated support structure 420, such as an I-beam, extends along the bottom of magnetron assembly 400 between side walls 422 and 424. A plurality of apertures 421 in support structure 420 allows the drive modules to be coupled to support structure 420 with standard fasteners. The power generation modules 414-1, 414-2, and the controller and battery module 418, can be coupled to support structure 420 is a similar manner.

A magnet bar structure 425 with an array of magnets (FIG. 11) is movably positioned along the bottom of magnetron assembly 400 below support structure 420. The drive modules 410 each include a motorized actuation mechanism operatively coupled to magnet bar structure 425 to provide adjustments in the position of magnet bar structure 425. The controller and battery module 418 includes an electronic controller and at least one rechargeable battery.

The power generation modules 414 are in electrical communication with the rechargeable battery such that electrical energy output from power generation modules 414 can charge the battery when needed. Electrical power from the battery is configured to energize the motorized actuation mechanisms and the electronic controller. Alternatively, the power generation modules can be configured to directly drive the motorized actuation mechanisms.

As depicted in FIG. 12, a first water inlet/outlet structure 426 at one end of magnetron assembly 400 extends through a first end structure 428 and is in fluid communication with a pair of cooling pipes 430, 432. A second water inlet/outlet structure 434 at an opposite end of magnetron assembly 400 extends through a second end structure 436 and is also in fluid communication with cooling pipes 430, 432. In one embodiment, a fiber optic holder 437 extends through water inlet/outlet structure 434. The fiber optic holder 437 is configured to support a fiber optic cable, which is coupled to an optical transceiver in communication with the electronic controller.

A set of target cylinder rollers 446 can be located on side walls 422 and 424. The rollers 446 provide movable surfaces that allow a target cylinder to more easily rotate around magnetron assembly 440.

In one embodiment, mechanical energy needed to drive power generation modules 414, can be harnessed from the flow of the cooling water through cooling pipe 430 or cooling pipe 432. For example, power generation modules 414 can include small turbine generators that are in fluid communication with water flowing through one or more of the cooling pipes. In an alternative embodiment, the mechanical energy needed to drive power generation modules 414 can be harnessed from the rotational energy of a target cylinder surrounding magnetron assembly 400.

Figure 13:
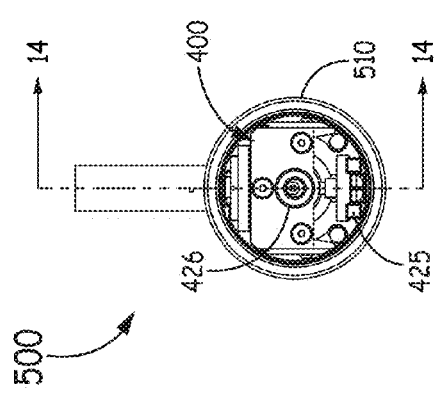
FIG. 13 is an end view of a rotary target cathode according one embodiment that contains the magnetron assembly of FIG. 11.
Figure 14:
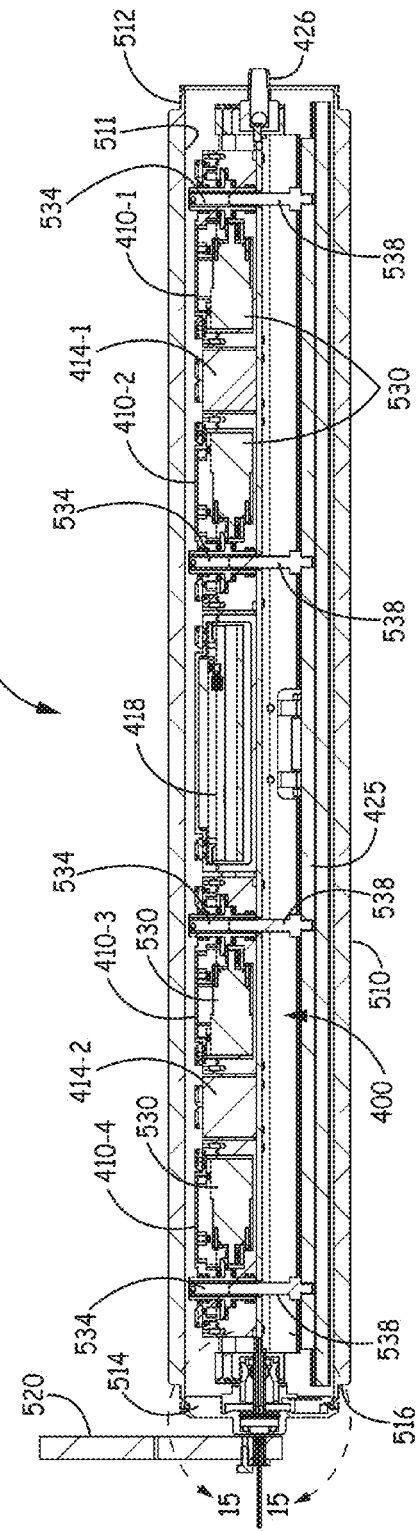
FIG. 14 is a cross-sectional side view of the rotary target cathode taken along line 14-14 in FIG. 13.

FIGS. 13 and 14 illustrate a rotary target cathode 500 that is implemented with magnetron assembly 400 according to one embodiment. The cathode 500 includes a rotatable target cylinder 510 having an inner surface 511 that defines an interior passageway. The magnetron assembly 400 is disposed in the interior passageway of target cylinder 510. The target cylinder 510 is configured at a proximal end 512 for mounting to an end block of a sputtering apparatus, such as end block 174 (FIG. 7). A target end cap 514 is affixed to a distal end 516 of target cylinder 510.

A fiber optic support 520 is configured to be mounted to a vacuum chamber wall of the sputtering apparatus, such as wall 215 (FIG. 9), with fiber optic support 520 being adjacent to but spaced apart from end cap 514. The end cap 514 and fiber optic support 520 are described in further detail with reference to FIG. 15 hereafter.

FIG. 14 shows further details of magnetron assembly 400. Each of drive modules 410 includes a motor 530 such as a stepper motor operatively coupled to an actuation mechanism 534. A set of actuation posts 538 is coupled between magnet bar structure 425 and each actuation mechanism 534. The motorized actuation mechanisms 534 provide for adjustments in the position of magnet bar structure 425 relative to inner surface 511 of target cylinder 510. For example, when target cylinder 510 erodes during operation of the sputtering apparatus, the motorized actuation mechanisms adjust the position of magnet bar structure 425 with respect to inner surface 511 in response to control signals from the electronic controller in controller and battery module 418.

Figure 15:
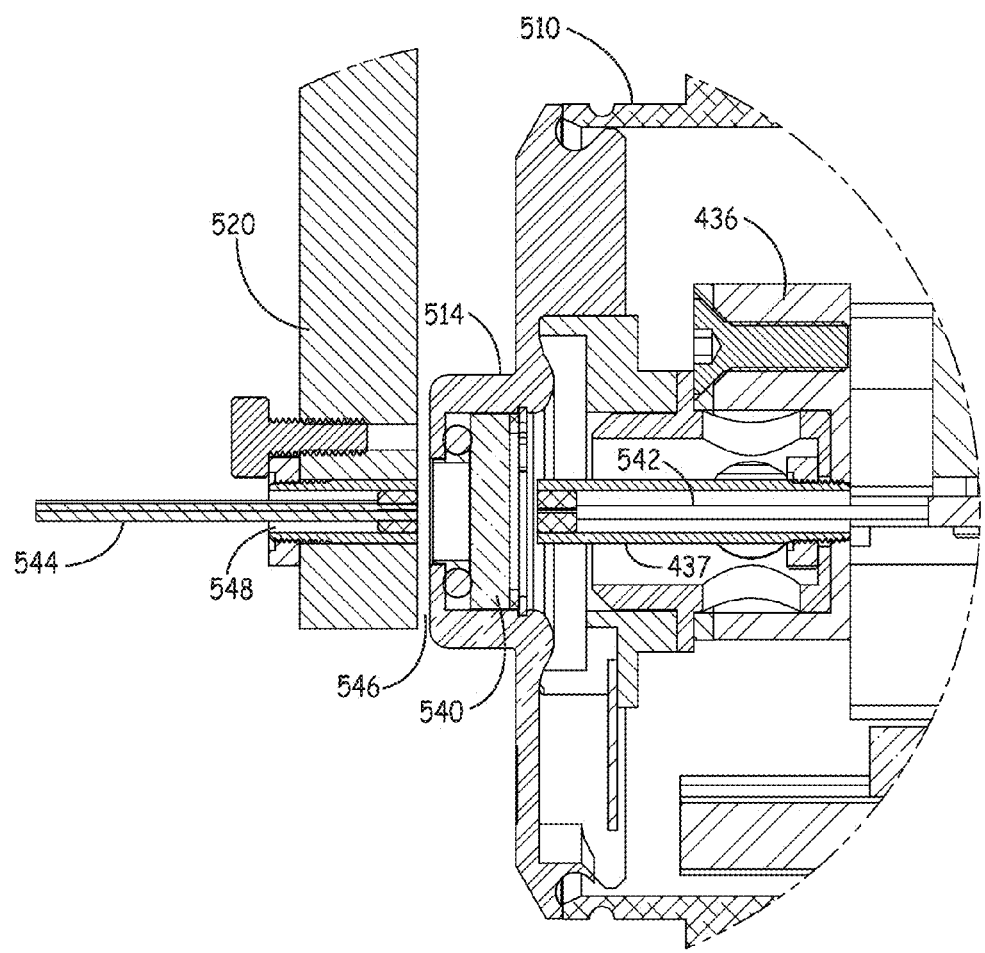
FIG. 15 is an enlarged sectional view of an end portion of the rotary target cathode taken along line 15-15 in FIG. 14.

As illustrated in FIG. 15, end cap 514 houses a window 540 that allows an optical signal to be transmitted between a first fiber optic cable 542 and a second fiber optic cable 544. The fiber optic support 520 is positioned such that a small gap 546 exists between facing surfaces of fiber optic support 520 and end cap 514, where the optical signal is transmitted between fiber optic cables 542 and 544. The first fiber optic cable 542 extends into fiber optic holder 437, coupled to end cap 514, from magnetron assembly 400. The second fiber optic cable 544 extends into an opening 548 of fiber optic support 520.

In one embodiment, fiber optic cable 544 is in optical communication with an optical transceiver located outside of a vacuum chamber in which target cathode 500 is implemented. The fiber optic cable 542 is optically coupled to an optical transceiver in communication with the electronic controller in controller and battery module 418. The tips of fiber optic cables 542 and 544, on either side of window 540, are in sufficient alignment such that optical signals can be effectively transmitted between fiber optic cables 542 and 544.

FIGS. 16 and 17 illustrate a rotary target cathode 600 that is implemented with magnetron assembly 400 according to another embodiment. The cathode 600 includes a rotatable target cylinder 610 that is configured at a proximal end 612 for mounting to an end block. A target end cap 614 is affixed to a distal end 616 of target cylinder 610.

A target end support 618, configured to be mounted to a vacuum chamber wall of a sputtering apparatus, is coupled to end cap 614. A fiber optic support 620, configured to be mounted to the vacuum chamber wall, is positioned such that fiber optic support 620 is adjacent to but spaced apart from end cap 614. The end cap 614 and fiber optic support 620 are described in further detail with reference to FIG. 18 hereafter.

FIG. 17 shows further details of magnetron assembly 400, which include the same components as shown in FIG. 14. As such, drive modules 410 each include a motor 530 coupled to an actuation mechanism 534. A set of actuation posts 538 is coupled between magnet bar structure 425 and each actuation mechanism 534. The motorized actuation mechanisms 534 provide for adjustments in the position of magnet bar structure 425 relative to the inner surface of target cylinder 610.

Figure 18:
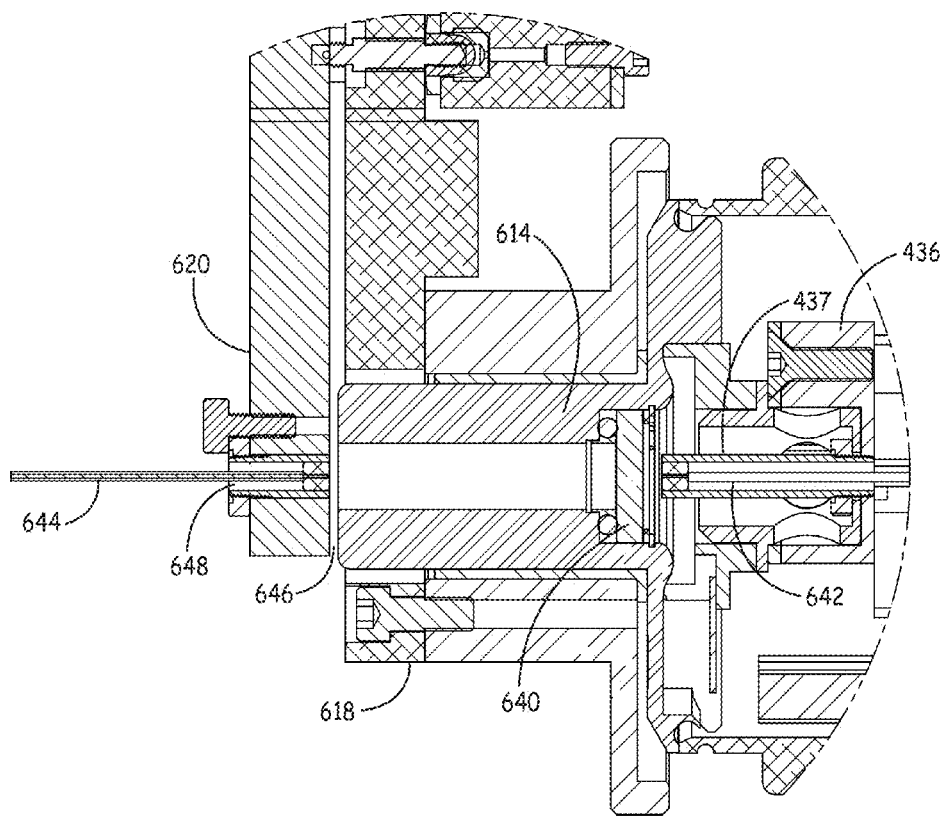
FIG. 18 is an enlarged sectional view of an end portion of the rotary target cathode taken along line 18-18 in FIG. 17.

As illustrated in FIG. 18, end cap 614 houses a window 640 that allows an optical signal to be transmitted between a first fiber optic cable 642 and a second fiber optic cable 644. The fiber optic support 620 is positioned such that a small gap 646 exists between facing surfaces of fiber optic support 620 and end cap 614, where the optical signal is transmitted between fiber optic cables 642 and 644. The first fiber optic cable 642 extends into fiber optic holder 437, coupled to end cap 614, from magnetron assembly 400. The second fiber optic cable 644 extends into an opening 648 of fiber optic support 620.

In one embodiment, fiber optic cable 644 is in optical communication with an optical transceiver located outside of a vacuum chamber in which target cathode 600 is implemented. The fiber optic cable 642 is optically coupled to an optical transceiver in communication with the electronic controller in controller and battery module 418. The tips of fiber optic cables 642 and 644, on either side of window 640, are in sufficient alignment such that optical signals can be effectively transmitted between fiber optic cables 642 and 644.

EXAMPLE EMBODIMENTS

Example 1 includes a magnetron assembly for a rotary target cathode, the magnetron assembly comprising: an elongated support structure; a magnet bar structure movably positioned below the support structure; a plurality of drive modules coupled to the support structure, the drive modules each including a motorized actuation mechanism operatively coupled to the magnet bar structure; a controller and battery module coupled to the support structure and in operative communication with the drive modules, the controller and battery module including an electronic controller and at least one rechargeable battery, the battery configured to energize each motorized actuation mechanism and the electronic controller; and one or more power generation modules coupled to the support structure and in electrical communication with the battery such that electrical energy output from the power generation modules recharges the battery.

Example 2 includes the magnetron assembly of Example 1, wherein the one or more power generation modules are configured to directly drive the motorized actuation mechanism in each of the drive modules.

Example 3 includes the magnetron assembly of any of Examples 1-2, further comprising at least one cooling pipe that extends along the support structure.

Example 4 includes the magnetron assembly of Example 3, wherein the one or more power generation modules are in fluid communication with the cooling pipe.

Example 5 includes the magnetron assembly of Example 4, wherein mechanical energy for driving the one or more power generation modules is harnessed from water that flows through the cooling pipe.

Example 6 includes the magnetron assembly of Example 5, wherein the one or more power generation modules include a turbine generator in fluid communication with the water that flows through the cooling pipe.

Example 7 includes the magnetron assembly of any of Examples 1-6, wherein the magnet bar structure includes an array of magnets that extends along and under the support structure.

Example 8 includes the magnetron assembly of any of Examples 1-7, further comprising a fiber optic cable optically coupled to an optical transceiver in communication with the electronic controller.

Example 9 includes the magnetron assembly of Example 8, further comprising a fiber optic holder that extends from one end of the magnetron assembly and supports an end section of the fiber optic cable.

Example 10 includes a rotary target cathode assembly for a sputtering apparatus, the rotary target cathode assembly comprising: a rotatable target cylinder having an inner surface that defines an interior passageway, the target cylinder configured at a proximal end for mounting to an end block of the sputtering apparatus; a target end cap affixed to a distal end of the target cylinder; and a magnetron assembly disposed in the interior passageway of the target cylinder. The magnetron assembly comprises: an elongated support structure; a magnet bar structure movably positioned below the support structure; a plurality of drive modules coupled to the support structure, the drive modules each including a motorized actuation mechanism operatively coupled to the magnet bar structure; a controller and battery module coupled to the support structure and in operative communication with the drive modules, the controller and battery module including an electronic controller and at least one rechargeable battery, the battery configured to energize each motorized actuation mechanism and the electronic controller; and one or more power generation modules coupled to the support structure and in electrical communication with the battery such that electrical energy output from the power generation modules recharges the battery. As the target cylinder erodes during operation of the sputtering apparatus, the motorized actuation mechanisms adjust the position of the magnet bar structure with respect to the inner surface of the target cylinder in response to control signals from the electronic controller.

Example 11 includes the rotary target cathode assembly of Example 10, further comprising a fiber optic support configured to be mounted to a vacuum chamber wall of the sputtering apparatus such that the fiber optic support is adjacent to and spaced apart from the target end cap.

Example 12 includes the rotary target cathode assembly of any of Examples 10-11, and further comprising a first fiber optic cable optically coupled to a first optical transceiver in communication with the electronic controller, the first fiber optic cable extending into the target end cap from the magnetron assembly.

Example 13 includes the rotary target cathode assembly of Example 12, and further comprising a second fiber optic cable optically coupled to a second optical transceiver located outside of the vacuum chamber wall, the second fiber optic cable extending into an opening in the fiber optic support.

Example 14 includes the rotary target cathode assembly of Example 13, wherein the target end cap includes a window that allows an optical signal to be transmitted between the first fiber optic cable and the second fiber optic cable.

Example 15 includes the rotary target cathode assembly of any of Examples 10-14, wherein the one or more power generation modules is configured to directly drive the motorized actuation mechanism in each of the drive modules.

Example 16 includes the rotary target cathode assembly of any of Examples 10-15, and further comprising at least one cooling pipe that extends along the support structure of the magnetron assembly.

Example 17 includes the rotary target cathode assembly of Example 16, wherein the one or more power generation modules are in fluid communication with the cooling pipe.

Example 18 includes the rotary target cathode assembly of Example 17, wherein mechanical energy for driving the one or more power generation modules is harnessed from water that flows through the cooling pipe.

Example 19 includes the rotary target cathode assembly of Example 18, wherein the one or more power generation modules include a turbine generator in fluid communication with the water that flows through the cooling pipe.

Example 20 includes the rotary target cathode assembly of any of Examples 10-16, wherein mechanical energy for driving the one or more power generation modules is harnessed from rotational energy of the target cylinder.

While a number of embodiments have been described, it will be understood that the described embodiments are to be considered only as illustrative and not restrictive, and that various modifications to the described embodiments may be made without departing from the scope of the invention. The scope of the invention is therefore indicated by the appended claims rather than by the foregoing description. All changes that come within the meaning and range of equivalency of the claims are to be embraced within their scope.

What is claimed is:

1. A magnetron assembly for a rotary target cathode, the magnetron assembly comprising:
    an elongated support structure;
    at least one cooling pipe that extends along the support structure;
    a magnet bar structure movably positioned below the support structure;
    a plurality of drive modules coupled to the support structure, the drive modules each including a motorized actuation mechanism operatively coupled to the magnet bar structure;
    a controller and battery module coupled to the support structure and in operative communication with the drive modules, the controller and battery module including an electronic controller and at least one rechargeable battery, the at least one rechargeable battery configured to energize each motorized actuation mechanism and the electronic controller; and
    one or more power generation modules coupled to the support structure and in electrical communication with the at least one rechargeable battery such that electrical energy output from the one or more power generation modules recharges the battery;
    wherein the one or more power generation modules are in fluid communication with the cooling pipe, and mechanical energy for driving the one or more power generation modules is harnessed from water that flows through the cooling pipe;
    wherein as the rotary target cathode erodes during a sputtering operation, the motorized actuation mechanisms adjust the position of the magnet bar structure with respect to an inner surface of the rotary target cathode in response to control signals from the electronic controller.

2. The magnetron assembly of claim 1, wherein the one or more power generation modules is configured to directly drive the motorized actuation mechanism in each of the drive modules.

3. The magnetron assembly of claim 1, wherein the one or more power generation modules include a turbine generator in fluid communication with the water that flows through the cooling pipe.

4. The magnetron assembly of claim 1, wherein the magnet bar structure includes an array of magnets that extends along and under the support structure.

5. The magnetron assembly of claim 1, further comprising a fiber optic cable optically coupled to an optical transceiver in communication with the electronic controller.

6. The magnetron assembly of claim 5, further comprising a fiber optic holder that extends from one end of the magnetron assembly and supports an end section of the fiber optic cable.

7. A rotary target cathode assembly for a sputtering apparatus, the rotary target cathode assembly comprising:
    a rotatable target cylinder having an inner surface that defines an interior passageway, the target cylinder configured at a proximal end for mounting to an end block of the sputtering apparatus;
    a target end cap affixed to a distal end of the target cylinder;
    a magnetron assembly disposed in the interior passageway of the target cylinder, the magnetron assembly comprising:
        an elongated support structure;
        at least one cooling pipe that extends along the support structure of the magnetron assembly;
        a magnet bar structure movably positioned below the support structure;
        a plurality of drive modules coupled to the support structure, the drive modules each including a motorized actuation mechanism operatively coupled to the magnet bar structure;
        a controller and battery module coupled to the support structure and in operative communication with the drive modules, the controller and battery module including an electronic controller and at least one rechargeable battery, the at least one rechargeable battery configured to energize each motorized actuation mechanism and the electronic controller; and
        one or more power generation modules coupled to the support structure and in electrical communication with the at least one rechargeable battery such that electrical energy output from the one or more power generation modules recharges the battery;

wherein the one or more power generation modules are in fluid communication with the cooling pipe, and mechanical energy for driving the one or more power generation modules is harnessed from water that flows through the cooling pipe;

wherein as the target cylinder erodes during operation of the sputtering apparatus, the motorized actuation mechanisms adjust the position of the magnet bar structure with respect to the inner surface of the target cylinder in response to control signals from the electronic controller.

8. The rotary target cathode assembly of claim 7, further comprising a fiber optic support configured to be mounted to a vacuum chamber wall of the sputtering apparatus such that the fiber optic support is adjacent to and spaced apart from the target end cap.

9. The rotary target cathode assembly of claim 8, further comprising a first fiber optic cable optically coupled to a first optical transceiver in communication with the electronic controller, the first fiber optic cable extending into the target end cap from the magnetron assembly.

10. The rotary target cathode assembly of claim 9, further comprising a second fiber optic cable optically coupled to a second optical transceiver located outside of the vacuum chamber wall, the second fiber optic cable extending into an opening in the fiber optic support.

11. The rotary target cathode assembly of claim 10, wherein the target end cap includes a window that allows an optical signal to be transmitted between the first fiber optic cable and the second fiber optic cable.

12. The rotary target cathode assembly of claim 7, wherein the one or more power generation modules is configured to directly drive the motorized actuation mechanism in each of the drive modules.

13. The rotary target cathode assembly of claim 7, wherein the one or more power generation modules include a turbine generator in fluid communication with the water that flows through the cooling pipe.

14. A rotary target cathode assembly for a sputtering apparatus, the rotary target cathode assembly comprising:
a rotatable target cylinder having an inner surface that defines an interior passageway, the target cylinder configured at a proximal end for mounting to an end block of the sputtering apparatus;
a target end cap affixed to a distal end of the target cylinder;
a magnetron assembly disposed in the interior passageway of the target cylinder, the magnetron assembly comprising:
an elongated support structure;
a magnet bar structure movably positioned below the support structure;
a plurality of drive modules coupled to the support structure, the drive modules each including a motorized actuation mechanism operatively coupled to the magnet bar structure;
a controller and battery module coupled to the support structure and in operative communication with the drive modules, the controller and battery module including an electronic controller and at least one rechargeable battery, the at least one rechargeable battery configured to energize each motorized actuation mechanism and the electronic controller; and
one or more power generation modules coupled to the support structure and in electrical communication with the at least one rechargeable battery such that electrical energy output from the one or more power generation modules recharges the battery;

wherein mechanical energy for driving the one or more power generation modules is harnessed from rotational energy of the target cylinder;

wherein as the target cylinder erodes during operation of the sputtering apparatus, the motorized actuation mechanisms adjust the position of the magnet bar structure with respect to the inner surface of the target cylinder in response to control signals from the electronic controller.

15. The rotary target cathode assembly of claim 14, further comprising a fiber optic support configured to be mounted to a vacuum chamber wall of the sputtering apparatus such that the fiber optic support is adjacent to and spaced apart from the target end cap.

16. The rotary target cathode assembly of claim 15, further comprising a first fiber optic cable optically coupled to a first optical transceiver in communication with the electronic controller, the first fiber optic cable extending into the target end cap from the magnetron assembly.

17. The rotary target cathode assembly of claim 16, further comprising a second fiber optic cable optically coupled to a second optical transceiver located outside of the vacuum chamber wall, the second fiber optic cable extending into an opening in the fiber optic support.

18. The rotary target cathode assembly of claim 17, wherein the target end cap includes a window that allows an optical signal to be transmitted between the first fiber optic cable and the second fiber optic cable.

19. The rotary target cathode assembly of claim 14, wherein the one or more power generation modules is configured to directly drive the motorized actuation mechanism in each of the drive modules.

* * * * *